United States Patent
Hatano et al.

[19]

[11] Patent Number: 5,880,526
[45] Date of Patent: Mar. 9, 1999

[54] BARRIER METAL LAYER

[75] Inventors: Tatsuo Hatano; Seishi Murakami, both of Yamanashi-ken, Japan

[73] Assignee: Tokyo Electron Limited, Tokyo, Japan

[21] Appl. No.: 843,239

[22] Filed: Apr. 14, 1997

[30] Foreign Application Priority Data

Apr. 15, 1996 [JP] Japan ................................. 8-116978

[51] Int. Cl.⁶ .................................................... H01L 23/48
[52] U.S. Cl. ............................................ 257/763; 257/915
[58] Field of Search .................................. 257/915, 767, 257/763, 750, 741

[56] References Cited

FOREIGN PATENT DOCUMENTS

| 63-128646 | 6/1988 | Japan ................................. 257/915 |
| 3-278431 | 12/1991 | Japan . |
| 6-151815 | 5/1994 | Japan ................................. 257/915 |

*Primary Examiner*—Olik Chaudhuri
*Assistant Examiner*—Nathan K. Kelley
*Attorney, Agent, or Firm*—Oblon, Spivak, McClelland, Maier & Neustadt, P.C.

[57] ABSTRACT

A barrier metal layer comprises a titanium film having a surface nitrided and modified by a nitrogen compound containing nitrogen atoms, and a titanium nitride film formed on a surface of the titanium film. The titanium film and titanium nitride film are interposed between a base layer, or a lower layer of a semiconductor device, and a metal film or an upper layer of the semiconductor device. A method of forming a barrier metal layer comprises the steps of forming a titanium film on an entire surface of an insulating layer including an inner wall of a hole, which hole is formed in a predetermined portion of the insulating layer to electrically connect a lower wiring layer and an upper wiring layer constituting a multilevel inter-connection structure of a semiconductor device, the upper wiring layer being provided on the insulating layer, the insulating layer being deposited on the lower wiring layer, the hole being formed to reach the lower wiring layer, and also forming the titanium film on a surface of the lower wiring layer exposed to a bottom of the hole, nitriding and modifying the titanium film by exposing the titanium film in an atmosphere of a nitrogen compound containing nitrogen atoms, and forming a titanium nitride film on the modified titanium film, the upper wiring layer being deposited on the titanium nitride layer.

11 Claims, 2 Drawing Sheets

BARRIER METAL LAYER

BACKGROUND OF THE INVENTION

The present invention relates to a barrier metal layer provided in a contact hole, a via hole, etc. formed in a semiconductor device and a method of forming the barrier metal layer.

Recently, semiconductor devices generally tend to adopt a multilevel interconnection structure as a circuit structure thereof, with an increasing demand for higher integration density. In the multilevel interconnection structure, a filling technique for filling a contact hole formed in a connection portion between a lower-level device and a higher-level wiring layer or a via hole formed in a connection portion between a lower-level wiring layer and a higher-level wiring layer is very important in order to ensure electrical connection between the wiring layer and device or between the wiring layers.

An aluminum alloy or a tungsten alloy is used as a filling material to be filled in the contact hole or via hole. If such an alloy is put in direct contact with an underlying silicon substrate or an aluminum wiring layer, a new alloy will form at the contact region (electrical connection region) due to a sucking effect of aluminum, etc. An increase in electric resistance in the electrical connection region due to the formation of the new alloy prevents a reduction in power consumption and an increase in operational speed, which are required in state-of-the-art semiconductor devices. In addition, $WF_6$ gas, which is one of process gases used in filling the hole with a tungsten alloy, enters the Si substrate and degrades the electrical characteristics, etc. of the Si substrate.

In general, in order to solve the above problems, a thin barrier metal layer of TiN (titanium nitride), etc. is provided on the entire walls of the contact hole or via hole before the aluminum alloy or tungsten alloy is filled in the hole. Then, an aluminum alloy, etc. is deposited on the barrier metal layer, thereby to fill the hole. FIG. 4 shows a wiring structure for electrically connecting upper and lower layers by using a barrier metal layer.

In FIG. 4, reference numeral 2 denotes a substrate formed of a Si wafer, etc. A predetermined metal film 4 is provided on the substrate 2. An insulating layer 6 formed of $SiO_2$, etc. is provided on the metal film 4. A contact hole 10, for example, is formed in a predetermined portion of the insulating layer 6 so as to reach the metal film 4. The contact hole 10 will ensure electrical contact between the metal film 4 and a metal film 8 of an aluminum alloy or a tungsten alloy which is to be provided over the insulating layer 6. A barrier metal layer 16 comprising a lamination structure of a Ti film 12 and a TiN film 14 is provided on the entire surface of the insulating layer 6 including the inner wall of the contact hole 10. The metal film 8 of the aluminum alloy or tungsten alloy is deposited on the barrier metal layer 16 so as to fill the contact hole 10.

As the design rule becomes stricter in accordance with the development in miniaturization and integration density of semiconductor devices, the line width and hole diameter decrease and the aspect ratio increases. The hole filling technique becomes difficult more and more. If the barrier metal layer is formed by physical vapor deposition (PVD) with a low step coverage performance, a problem will arise in that electrical resistance increases because a layer is not adequately deposited on the bottom of the hole. Under the circumstances, the use of chemical vapor deposition (CVD) with a high step coverage performance has been studied at present. When a CVD method is applied to the formation of the barrier metal layer, the Ti film is, in general, formed by a physical vapor deposition (PVD) method such as plasma sputtering, and then the TiN film of the barrier metal layer is formed by the CVD method. When the TiN film is formed by the CVD method, the following material gas is mainly used: $TiCl_4$ (titanium tetrachloride), $NH_3$ (ammonia), or molecules including nitrogen atoms (e.g. methyl-hydrazine). In this case, the $TiCl_4$ corrodes the underlying Ti film and the contact between the Ti film and TiN film deteriorates.

BRIEF SUMMARY OF THE INVENTION

The object of the present invention is to provide a barrier metal layer with good contact (interface) between a titanium film and a titanium nitride film, and a method of forming the barrier metal layer.

This object is achieved by a barrier metal layer comprising a titanium film having a surface nitrided and modified by a nitrogen compound containing nitrogen atoms, and a titanium nitride film formed on a surface of the titanium film, wherein the titanium film and titanium nitride film are interposed between a base layer, or a lower layer of a semiconductor device, and a metal film or an upper layer of the semiconductor device.

The object is also achieved by a method of forming a barrier metal layer comprises the steps of: forming a titanium film on an entire surface of an insulating layer including an inner wall of a hole, which hole is formed in a predetermined portion of the insulating layer to electrically connect a first wiring layer and a second wiring layer constituting a multilevel interconnection structure of a semiconductor device, the second wiring layer being provided on the insulating layer, the insulating layer being deposited on the first wiring layer, the hole being formed to reach the first wiring layer, and also forming the titanium film on a surface of the first wiring layer exposed to a bottom of the hole; nitriding and modifying the titanium film by exposing the titanium film in an atmosphere of a nitrogen compound containing nitrogen atoms; and forming a titanium nitride film on the modified titanium film, the second wiring layer being deposited on the titanium nitride layer.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will now be described with reference to the accompanying drawings.

FIGS. 1A to 1E illustrate the steps of a method according to the embodiment for electrically connecting upper and lower wiring layers by using a barrier metal layer.

Figure 1A:
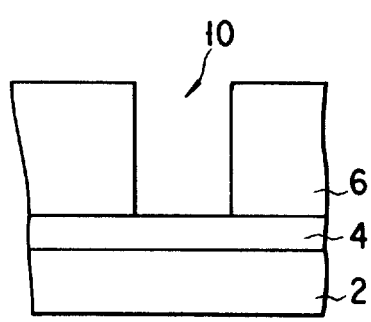
FIG. 1A is a cross-sectional view showing a state in which a contact hole, in which a barrier metal layer according to an embodiment of the present invention is to be filled, is formed in an insulating layer.
Figure 1B:
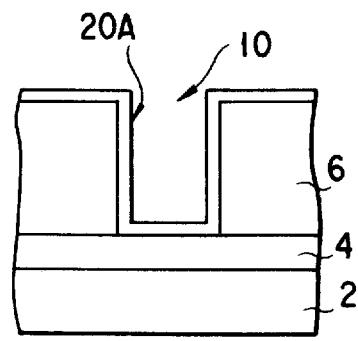
FIG. 1B is a cross-sectional view showing a state in which a Ti (titanium) film is formed in a contact hole.
Figure 1C:
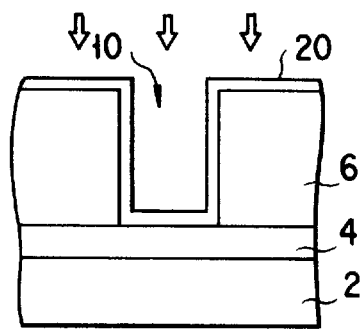
FIG. 1C is a cross-sectional view showing a state in which the Ti film is modified.
Figure 1D:
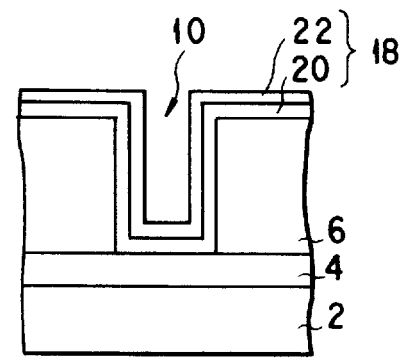
FIG. 1D is a cross-sectional view showing a state in which a TiN (titanium nitride) film is provided on the modified Ti film.
Figure 1E:
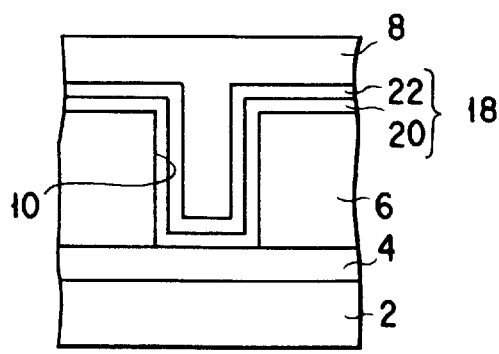
FIG. 1E is a cross-sectional view showing a state in which a metal film is deposited on the barrier meal layer, thereby filling the contact hole.
Figure 4:
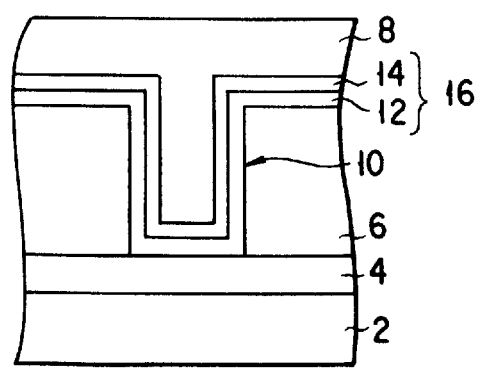
FIG. 4 is a cross-sectional view showing a conventional wiring structure wherein upper and lower layers are electrically connected by using a barrier metal layer.

In FIG. 1E, reference numeral 2 denotes a substrate formed of a Si wafer, etc. A metal film (wiring layer) 4 is provided as a lower base layer on the surface of the substrate 2. The metal film 4 forms a wiring pattern of circuit elements provided on the lower base layer. An insulating layer 6 formed of $SiO_2$, etc. is provided as an interlevel dielectric film on the metal film 4. A contact hole 10, for example, is formed in a predetermined portion of the insulating layer 6 so as to reach the metal film 4. The contact hole 10 will ensure electrical contact between the metal film 4 and a metal film (a wiring layer for forming a wiring pattern of circuit elements provided on an upper layer) 8 of an aluminum alloy or a tungsten alloy which is to be provided over the insulating layer 6. The contact hole 10 is formed by, e.g. etching such that the metal film 4 is exposed to the bottom of the hole 10. A thin barrier metal layer 18 according to the embodiment of the invention is provided on the entire surface of the insulating layer 6 including the inner wall of the contact hole 10. The metal film 8 is deposited on the barrier metal layer 18 so as to fill the contact hole 10. The surface of the metal film 8 is flattened.

The barrier metal layer 18 has a double-layer structure and comprises an underlying titanium film 20 formed of a titanium film subjected to surface modification, and a titanium nitride film 22 provided on the surface of the underlying titanium film 20.

A method of forming the barrier metal layer 18 and a method of electrically connecting the upper and lower wiring layers 4 and 8 by using the barrier metal layer 18 will now be described in a step-by-step manner.

FIG. 1A shows a state in which the contact hole 10 is formed in the insulating layer 6 deposited on the underlying metal film 4 by a conventional method. As is shown in FIG. 1A, the contact hole 10 reaches the metal film 4, and the metal film 4 is exposed to the bottom of the contact hole 10.

In FIG. 1B, a titanium film 20A about 50 nm thick is formed on the entire surface of the insulating layer 6 including the inner wall of the contact hole 10. The titanium film 20A is formed by means of plasma sputtering or CVD. In particular, the formation of the titanium film 20A by CVD is advantageous than that of the titanium film 20A by plasma sputtering. In the case of the CVD, even if the diameter of the hole 10 is decreased and the aspect ratio thereof is increased because of an increase in the degree of integration and miniaturization, the titanium film 20A is fully and uniformly formed even on the bottom and side wall of the hole 10.

The titanium film 20A is subjected to a surface modification process, as shown in FIG. 1C, and a underlying titanium film 20 is formed. In the surface modification process, the substrate 2 shown in FIG. 1B is carried into a chamber and exposed for a predetermined time period to an atmosphere of a hydrazine derivative compound (e.g. methyl-hydrazine) including nitrogen atoms. During the thermal process, the surface of titanium film 20A is nitrided, and a very thin titanium nitride film (i.e. modified titanium nitride film) is formed on the titanium. Specifically, the surface of the titanium film 20A is modified, and the titanium film 20A becomes the underlying titanium film 20.

As compared to a non-modified Ti film, the modified titanium nitride film has durability to a $TiCl_4$ gas used in the next step and has such properties that it is not easily etched.

Figures 2A, 2B:
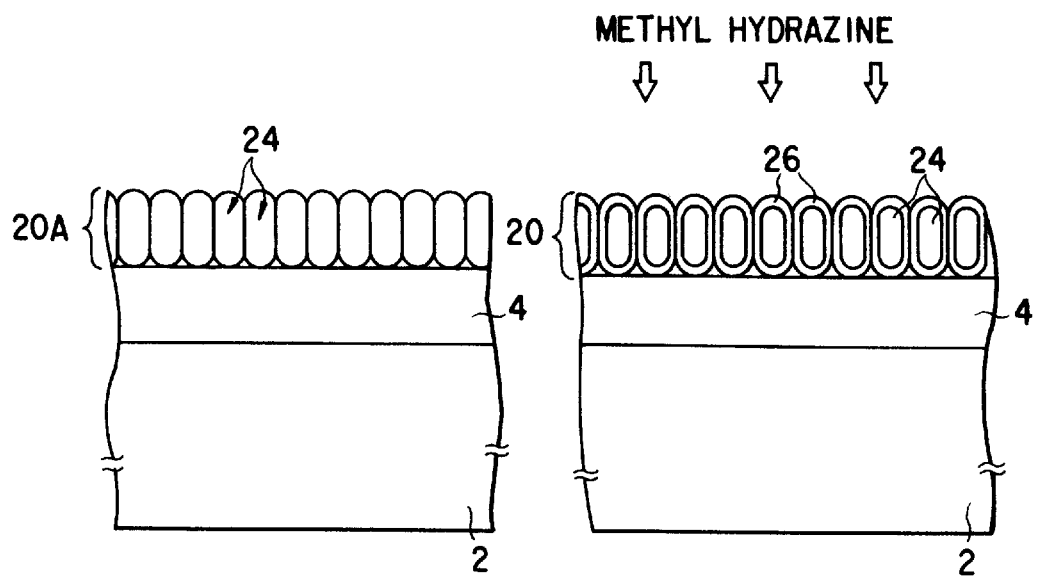
FIG. 2A is an enlarged cross-sectional view showing a state of the Ti film before surface modification.
FIG. 2B is an enlarged cross-sectional view showing a state of the Ti film after surface modification.

FIGS. 2A and 2B illustrate microscopically the process of surface modification of the titanium film 20A. As is shown in FIG. 2A, titanium crystals 24 of the titanium film 20A are columnar and there are a number of voids among the titanium crystals 24 in which gas can enter. If a methyl-hydrazine gas is made to act upon the titanium film 20A having this structure, as shown in FIG. 2B, modified titanium nitride films 26 are formed on the entire surfaces of the columnar titanium crystals 24 by the following reaction formula:

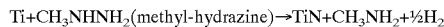

$$Ti + CH_3NHNH_2 (methyl\text{-}hydrazine) \rightarrow TiN + CH_3NH_2 + \tfrac{1}{2}H_2$$

The modified titanium nitride films 26 have physical properties different from those of a titanium nitride film 22 to be formed on the underlying titanium film 20 in the subsequent step. Specifically, the modified titanium nitride films 26 are films obtained by nitriding the surfaces of the columnar titanium crystals 24 of titanium film 20A. Analysis results by XPS (X-ray photoelectron spectroscopy) confirm that only the surfaces of titanium crystals 24 were nitrided by the methyl-hydrazine gas. By contrast, not only the surface but also the entire body of the titanium nitride film 22 to be formed on the underlying titanium film 20 is formed of titanium nitride. The titanium nitride film 22 and underlying titanium film 20 have entirely different physical properties as materials.

The process conditions for the surface modification of titanium film 20A are, for example, as follows:

Pressure: 0.1 to atmospheric pressure,

Flow rate of monomethyln hydrazine: 1 to 100 sccm,

Flow rate of carrier gas: 10 to 1,000 sccm

Process temperature: 200° to 800° C., and

Process time: 10 to 600 sec.

As regards the above conditions, the process time depends on the thickness of the titanium film 20A. In general, the process time is 10 to 600 sec. An He (helium) gas is generally used as a carrier gas. Other inert gases such as Ar gas or Xe gas may be used. Aside from monomethyl hydrazine, dimethyl hydrazine may be used as a hydrazine derivative compound.

Figure 3:
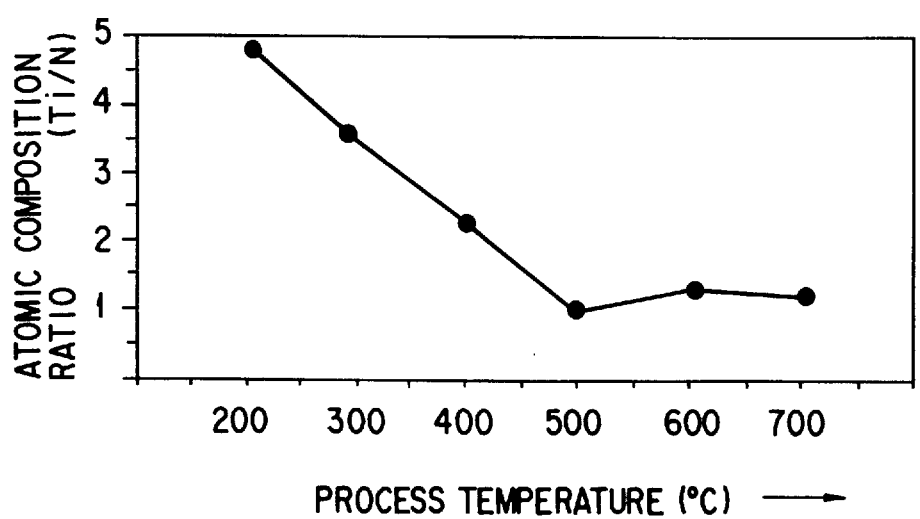
FIG. 3 is a graph showing the relationship between a process temperature and an atomic composition ratio Ti/N of a modified TiN film.

FIG. 3 shows a relationship between the process temperature and the atomic composition ratio Ti/N of modified titanium nitride film 26. As seen from FIG. 3, if the process temperature exceeds 200° C., a modification reaction begins.

At the process temperature of about 500° C., the composition ratio between Ti and N becomes 1:1. The composition ratio between Ti and N remains 1:1 until the process temperature rises to about 700° C. Accordingly, the process temperature is preferably 200° C. to 700° C., and more preferably 500° C. to 700° C. In the present embodiment, considering the fact that the titanium nitride film 22 is formed at 500° C. to 550° C. after the surface modification of the titanium film 20A, the process temperature for the surface modification is set in the range of 500° C. to 550° C. In addition, if the surface modification is carried out in the thermal process, as in the present embodiment, the gas. permeates sufficiently deep into the titanium film 20A. Thus, the surface of the titanium film 20A is adequately nitrided in a short time. However, a plasma process may be substituted for the thermal process in order to carry out the surface modification.

After the underlying titanium film 20 has been formed by subjecting the titanium film 20A to the surface modification, the titanium nitride film 22 is formed on the entire surface of the underlying titanium film 20 by heat treatment, as shown in FIG. 1D. In this case, the titanium nitride film 22 about 50 nm thick is formed according to the following reaction formula:

$$TiCl_4+NH_3+CH_3NHNH_2(\text{methyl-hydrazine}) \rightarrow TiN+CH_3NH+HCl$$

The titanium nitride film 22 is formed successively in the same chamber as has been used in performing the surface modification process, with the kind and pressure of supply gas being varied.

The process conditions for forming the titanium nitride film 22 are, for example, as follows:

Pressure: 0.1 to 10 Torr,

Flow rate of monomethyl hydrazine: 1 to 100 sccm,

Flow rate of $NH_3$ gas: 100 to 1000 sccm

Flow rate of $TiCl_4$ gas: 10 to 100 sccm

Flow rate of carrier gas: 10 to 1,000 sccm

Process temperature: 500° to 650° C., and

Process time: 60 to 180 sec.

After the titanium nitride film 22 has been formed to constitute the barrier metal layer 18, the metal film 8 of the aluminum alloy or tungsten alloy is deposited on the barrier metal layer 18 by means of ordinary CVD or plasma sputtering, as shown in FIG. 1E, thereby to fill the contact hole 10.

As has been described above, in the present embodiment, the surface of the titanium film 20A is nitrided by the hydrazine derivative compound (e.g. methyl-hydrazine) having nitrogen atoms and the modified titanium nitride films 26 having durability to $TiCl_4$ gas used in the formation of titanium nitride film 22 and such properties as not to permit easy etching are formed. Thus, when the titanium nitride film 22 is formed, the underlying titanium film 20 is not etched by $TiCl_4$, and the contact between the underlying titanium film 20 and titanium nitride film 22 is improved. Specifically, the surface of the underlying titanium film 20 is kept flat and no fine irregularities occur on the surface of the underlying titanium film 20. The interface between the underlying titanium film 20 and titanium nitride film 22 is remarkably improved, and the titanium nitride film 22 is not removed from the underlying titanium film 20.

In the present embodiment, the process temperature for the surface modification process of titanium film 20A is set at 500° C. to 550° C., which is substantially equal to the process temperature for the formation of titanium nitride film 22 in the subsequent step. Thus, without providing a time-consuming temperature changing step, the surface modification process and the titanium nitride film forming process can be carried out successively and the through-put is increased.

The inventor of the present invention evaluated the barrier metal layer including the surface-modified titanium film 20A and a barrier metal layer without such surface-modified titanium film. It was confirmed that the non-surface-modified titanium film was etched by $TiCl_4$ and the surface thereof was made considerably irregular. In other words, the $TiCl_4$ (titanium tetrachloride) used in forming the titanium nitride film 22 etched and corrodes the titanium film. By contrast, the surface-modified titanium film was not etched and the surface thereof was kept flat.

In the present embodiment, the barrier metal layer 18 is filled in the contact hole 10. However, the barrier metal layer 18 may be filled in a via hole for connecting a lower wiring layer and an upper wiring layer. In the present embodiment, the base layer is the conductive metal layer 4. However, the base layer may be a non-conductive layer such as an interlevel dielectric film. In this case, if the barrier metal layer 18 is interposed between the dielectric film having or not having a groove and the wiring pattern, the interface between the dielectric film and wiring pattern can be improved (see the portion of the barrier metal layer 18, which lies on the surface of the insulating layer 6 except the inside wall of the contact hole 10). Furthermore, in the present embodiment, the silicon substrate is used as the substrate. However, needless to say, the barrier metal layer 18 of the present invention is applicable to a glass substrate, an LCD substrate, etc.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A barrier metal layer comprising:
   a titanium film comprising a plurality of columnar titanium crystals modified by a nitrogen compound containing nitrogen atoms such that each of said titanium crystals has a surface completely covered by a titanium nitride coating; and
   a titanium nitride film provided on a surface of the titanium film,
   wherein said titanium film and said titanium nitride film are interposed between a base layer which constitutes a lower layer of a semiconductor device, and a metal film which constitutes an upper layer of the semiconductor device.

2. The barrier metal layer according to claim 1, wherein the base layer constituting the lower layer is a metal film, and the metal film constituting the upper layer is electrically connected to the metal film constituting the lower layer via a hole formed in an insulating layer provided on the metal film constituting the lower layer.

3. The barrier metal layer according to claim 2, wherein said hole is one of a contact hole and a via hole.

4. The barrier metal layer according to claim 1, wherein said nitrogen compound is a hydrazine derivative compound having nitrogen atoms.

5. The barrier metal layer according to claim 4, wherein said hydrazine derivative compound is methyl-hydrazine.

6. A barrier metal layer comprising:

a titanium film comprising a plurality of columnar titanium crystals, each of said titanium crystals having a surface completely covered by a coating film resistant to etching by a titanium nitride film forming gas; and a titanium nitride film provided on a surface of the titanium film, wherein said titanium film and said titanium nitride film are interposed between a base layer which constitutes a lower layer of a semiconductor device, and a metal film which constitutes an upper layer of the semiconductor device.

7. The barrier metal layer according to claim 6, wherein said titanium nitride film forming gas is a $TiCl_4$ gas.

8. The barrier metal layer according to claim 6, wherein the base layer constituting the lower layer is a metal film, and the metal film constituting the upper layer is electrically connected to the metal film constituting the lower layer via a hole formed in an insulating layer provided on the metal film constituting the lower layer.

9. The barrier metal layer according to claim 8, wherein said hole is one of a contact hole and a via hole.

10. The barrier metal layer according to claim 6, wherein said coating film is formed by making a hydrazine derivative compound having nitrogen atoms act upon the titanium film.

11. The barrier metal layer according to claim 10, wherein said hydrazine derivative compound is methyl-hydrazine.

* * * * *